United States Patent [19]

Kaneko et al.

[11] Patent Number: 4,740,923

[45] Date of Patent: Apr. 26, 1988

[54] MEMORY CIRCUIT AND METHOD OF CONTROLLING THE SAME

[75] Inventors: Kenji Kaneko, Sagamihara; Jun Ishida, Koganei; Yoshimune Hagiwara, Hachioji; Hitoshi Matsushima, Tachikawa; Hirotada Ueda, Kokubunji, all of Japan

[73] Assignees: Hitachi, Ltd; Hitachi Micro Computer Engineering, Ltd., both of Tokyo, Japan

[21] Appl. No.: 799,640

[22] Filed: Nov. 19, 1985

[30] Foreign Application Priority Data

Nov. 21, 1984 [JP] Japan .............................. 59-244496

[51] Int. Cl.[4] .............................................. G11C 7/00
[52] U.S. Cl. .................................... 365/194; 365/189; 365/230
[58] Field of Search ........................ 365/189, 194, 230

[56] References Cited

U.S. PATENT DOCUMENTS 4,608,671 8/1986 Shimizu et al. ..................... 365/230

Primary Examiner—James W. Moffitt
Attorney, Agent, or Firm—Antonelli, Terry & Wands

[57] ABSTRACT

A memory circuit is divided into a plurality of memory blocks, and an address register and a delay register are disposed in each memory block. Therefore, a read or write operation and a shifting operation of the address for storing data inside a memory matrix can be realized by a pipeline technique, and hence a memory circuit having a high processing speed is obtained.

9 Claims, 8 Drawing Sheets

| A₋₄ | D₋₄ |
|---|---|
| A₋₂ | D₋₂ |
| A₀ | D₀ |
| A₂ | D₂ |
| A₄ | D₄ |
| A₆ | D₆ |

M2 511

| A₋₃ | D₋₃ |
|---|---|
| A₋₁ | D₋₁ |
| A₁ | D₁ |
| A₃ | D₃ |
| A₅ | D₅ |
| A₇ | D₇ |

| A₋₄ | D₋₄ |
|---|---|
| A₋₂ | D₋₂ |
| A₀ | D₀ |
| A₂ | D₋₁ |
| A₄ | D₁ |
| A₆ | D₃ |

M2 513

| A₋₃ | D₋₃ |
|---|---|
| A₋₁ | D₋₁ |
| A₁ | D₋₂ |
| A₃ | D₀ |
| A₅ | D₂ |
| A₇ | D₄ |

FIG. 6

| A₁₁ (D₁₁) | A₁₂ (D₁₂) | A₁₃ (D₁₃) | A₁₄ (D₁₄) | A₁₅ (D₁₅) | A₁₆ (D₁₆) |
|---|---|---|---|---|---|
| A₂₁ (D₂₁) | A₂₂ (D₂₂) | A₂₃ (D₂₃) | A₂₄ (D₂₄) | A₂₅ (D₂₅) | A₂₆ (D₂₆) |
| A₃₁ (D₃₁) | A₃₂ (D₃₂) | A₃₃ (D₃₃) | A₃₄ (D₃₄) | A₃₅ (D₃₅) | A₃₆ (D₃₆) |
| A₄₁ (D₄₁) | A₄₂ (D₄₂) | A₄₃ (D₄₃) | A₄₄ (D₄₄) | A₄₅ (D₄₅) | A₄₆ (D₄₆) |
| A₅₁ (D₅₁) | A₅₂ (D₅₂) | A₅₃ (D₅₃) | A₅₄ (D₅₄) | A₅₅ (D₅₅) | A₅₆ (D₅₆) |
| A₆₁ (D₆₁) | A₆₂ (D₆₂) | A₆₃ (D₆₃) | A₆₄ (D₆₄) | A₆₅ (D₆₅) | A₆₆ (D₆₆) |

| $A_{-12}$ | $D_{-12}$ |
| $A_{-8}$ | $D_{-8}$ |
| $A_{-4}$ | $D_{-4}$ |
| $A_0$ | $D_0$ |
| $A_4$ | $D_4$ |

M2 911

| $A_{-11}$ | $D_{-11}$ |
| $A_{-7}$ | $D_{-7}$ |
| $A_{-3}$ | $D_{-3}$ |
| $A_1$ | $D_1$ |
| $A_5$ | $D_5$ |

M3 912

| $A_{-10}$ | $D_{-10}$ |
| $A_{-6}$ | $D_{-6}$ |
| $A_{-2}$ | $D_{-2}$ |
| $A_2$ | $D_2$ |
| $A_6$ | $D_6$ |

M4 913

| $A_{-9}$ | $D_{-9}$ |
| $A_{-5}$ | $D_{-5}$ |
| $A_{-1}$ | $D_{-1}$ |
| $A_3$ | $D_3$ |
| $A_7$ | $D_7$ |

| $A_{-12}$ | $D_{-12}$ |
| $A_{-8}$ | $D_{-8}$ |
| $A_{-4}$ | $D_{-4}$ |
| $A_0$ | $D_0$ |
| $A_4$ | $D_2$ |

M2 915

| $A_{-11}$ | $D_{-11}$ |
| $A_{-7}$ | $D_{-7}$ |
| $A_{-3}$ | $D_{-3}$ |
| $A_{-1}$ | $D_{-1}$ |
| $A_5$ | $D_3$ |

M3 916

| $A_{-10}$ | $D_{-10}$ |
| $A_{-6}$ | $D_{-6}$ |
| $A_{-2}$ | $D_{-2}$ |
| $A_2$ | $D_0$ |
| $A_6$ | $D_4$ |

M4 917

| $A_{-9}$ | $D_{-9}$ |
| $A_{-5}$ | $D_{-5}$ |
| $A_{-1}$ | $D_{-1}$ |
| $A_3$ | $D_1$ |
| $A_7$ | $D_5$ |

MEMORY CIRCUIT AND METHOD OF CONTROLLING THE SAME

BACKGROUND OF THE INVENTION

This invention relates to a high speed memory circuit having a function which can shift by n addresses a data storage address simultaneously with a read-out operation of data held by a memory circuit, and also to a method of controlling the high speed memory circuit.

In order to accomplish a high speed operation of an integrated circuit, a method has been practised recently which divides the circuit into several functional blocks and effects data processing using a pipeline technique to shorten the through-put of the circuit as a whole. However, the through-put time is determined by a circuit which requires the longest processing time among these functional blocks.

If a memory circuit has a read cycle and a write cycle (the processing time of both of which is hereby assumed to be T) in a single operation cycle, the operation cycle of the memory circuit is 2T, but if either one of the read operation and the write operation is permitted in one operation cycle of the memory, the operation cycle of the memory circuit becomes the time T, so that the through-put time of the integrated circuit as a whole can be shortened, as is well known in the art.

In various operations for signal processing, however, an operation which reads out the data from the memory and an operation which shifts the address for storing the read-out data from an address $a_o$ to $a_{o+n}$ (a so-called "read-modify-write operation") is frequently performed. In such a case, the 2T time is necessary for the read-modify-write operation for both of the two systems described above, and the processing speed drops remarkably.

SUMMARY OF THE INVENTION

It is an object of the present invention to provide a memory circuit which can process each memory operation cycle at a high speed and a method of controlling such a memory circuit.

It is another object of the present invention to provide a memory circuit which can process a read-modify-write operation at a high speed and a method of controlling the memory circuit.

To accomplish the objects described above, the memory circuit in accordance with the present invention executes only either one of the read cycle and the write cycle within one instruction cycle, and executes a write operation for shifting the address value of the read-out data by an n address in parallel with a data read-out operation only during a read-modify-write operation. Thus, the memory circuit of the invention can reduce the processing time of the read-modify-write operation to half of of that in conventional memory circuits.

The present invention divides the memory circuit into at least two memory blocks. An address register for taking and storing an address when a given block is selected, and a delay register for taking data which is read out of each of the memory blocks during the read operation. In the normal operation, only one of the read operation and the write operation is executed within one instruction cycle to thereby reduce the through-put time of the memory circuit operation.

When the address for storing the read-out data is to be shifted, the read-modify-write operation is executed by a pipeline technique. In other words, within one instruction cycle, the memory block whose address is selected takes the address thereinto, decodes the address, reads out data, delivers the data to a data bus, takes the data into its delay register and delivers the data of the delay register which was previously stored therein, as an input to the other memory block whose address is not selected. The memory block which is to receive the data thus transferred receives the data within the same instruction cycle, again decodes the address that has been held by its address register, and writes in the data. In this manner, the read-modify-write operation can be executed without extending the through-put time.

BRIEF DESCRIPTION OF THE DRAWINGS

FIG. 5A is a table showing the correspondence between the address and the data before a shift operation;

FIG. 5B is a table showing the correspondence between the address and the data after a shift operation;

FIG. 6 is a table showing a two-dimensional image divided into pixels;

FIG. 9A is a table showing the correspondence between the address and the data before a shift operation; and FIG. 9B is a table showing the correspondence between the address and the data after a shift operation;

Figure 1A:
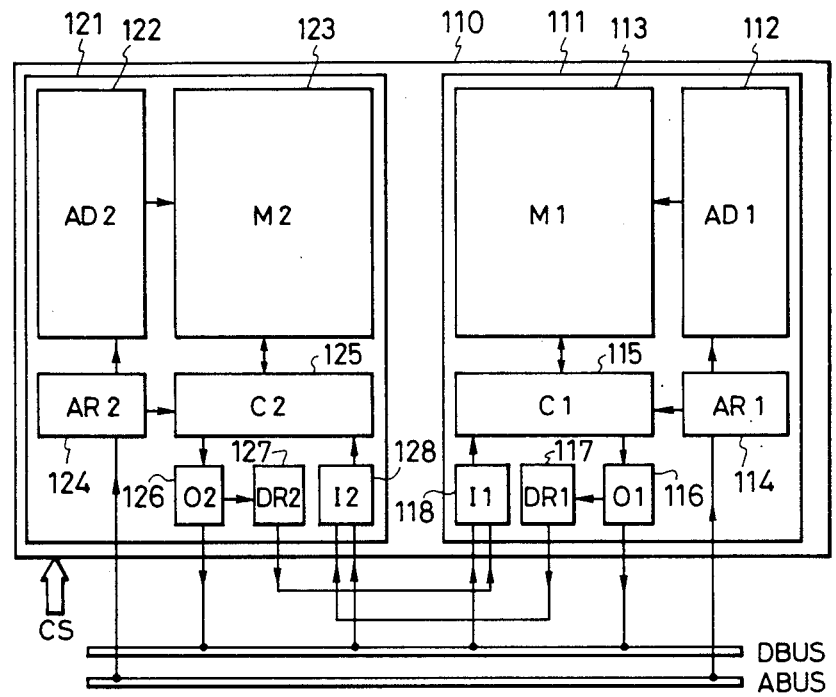
FIG. 1A is a circuit diagram useful for explaining a first embodiment of the present invention.

In the drawings, reference numerals represent the following constituents, respectively:

110 ... memory circuit,
111, 121 ... memory block,
112, 122 ... address decoder,
113, 123 ... memory matrix,
114, 124 ... address register,
115, 125 ... column selector,
116, 126 ... output register,
117, 127 ... delay register,
118, 128 ... input register,
DBUS ... data bus,
ABUS ... address bus,
130, 131 ... correspondence between data and address,
210, 211, 212, 213, 214 .. correspondence between data and address,
310 ... memory circuit,
311, 321 ... memory block,
312, 322 ... address decoder,
313, 323 ... memory matrix,
314, 324 ... address register,
315, 325 ... column selector,
316, 326 ... input register,
317, 327 ... delay register, 318, 328 ... output register,
510, 511, 512, 513 ... correspondence between data and address,
710 ... memory circuit,
711, 721, 731, 741 ... memory block,
712, 722, 732, 742 ... address decoder,
713, 723, 733, 743 ... memory matrix,
714, 724, 734, 744 ... address register,
715, 725, 735, 745 ... column selector,
716, 726, 736, 746 ... output register,
717, 727, 737, 747 ... delay register,
718, 728, 738, 748 ... input register,
910, 911, 912, 913, 914, 915, 916, 917 ... correspondence between data and address.

DESCRIPTION OF THE PREFERRED EMBODIMENTS

Hereinafter, some preferred embodiments of the invention will be described.

Figure 1B:
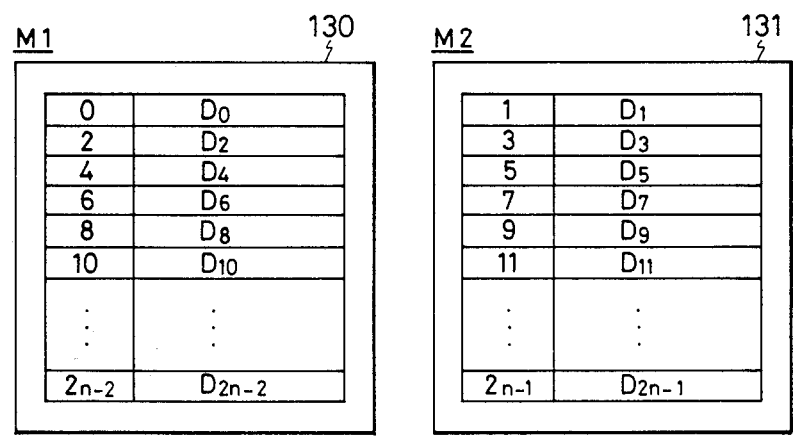
FIG. 1B is a table showing the correspondence between an address and data for each divided memory circuit block.

FIGS. 1A and 1B show a memory circuit in accordance with a first embodiment of the invention. FIG. 1A shows the structure of a memory circuit 110 consisting of two memory blocks 111 and 121. Each memory block consists of an address register AR1 (114), AR2 (124), an address decoder AD1 (112), AD2 (122), a column selector C1 (115), C2 (125), a memroy matrix M1 (113), M2 (123), an input data block I1 (118), I2 (128), an output data block 01 (116), 02 (126) and a delay register DR1 (117), DR2 (127).

The input of the input data block I1 is an output of a data bus DBUS and the delay register DR2 while the input of the input data block I2 is the output of the data bus DBUS and the delay register DR1.

A control signal CS which is produced by a control circuit outside the memory by a micro instruction determines from which of the data bus DBUS and the delay registers DR2, DR1 the input data blocks I1, I2 receive the data. This micro instruction describes which operation the memory should execute (e.g., read or write or read-modify-write).

FIG. 1B shows the addresses of two memory matrices M1, M2 of the memory circuit 110 of FIG. 1A. Reference numeral 130 represents the addresses of the memory matrix M2 which are even addresses while reference numeral 131 represents the addresses of M2 which are odd addresses. When the address of an address bus ABUS is even-numbered, the address at that time is taken into an address register AR1 and is held until the address of the address bus ABUS again becomes even-numbered. When the address of the address bus ABUS is odd-numbered, the address at that time is taken into the address register AR2, and is held until the address of the address bus ABUS again becomes odd-numbered. In a normal operation, only the memory block 111 or 121 which has received the address operates and executes the read or write operation in accordance with the micro instruction.

If the micro instruction instructs a read operation, the memory block reads out the data from its memory matrix, sends it to the data bus DBUS, takes the data into its delay register DR1 or DR2 and holds the data until this memory block is again selected.

If the micro instruction instructs a write operation, the memory block takes the data of the data bus DBUS into its memory matrix.

Figure 2A:
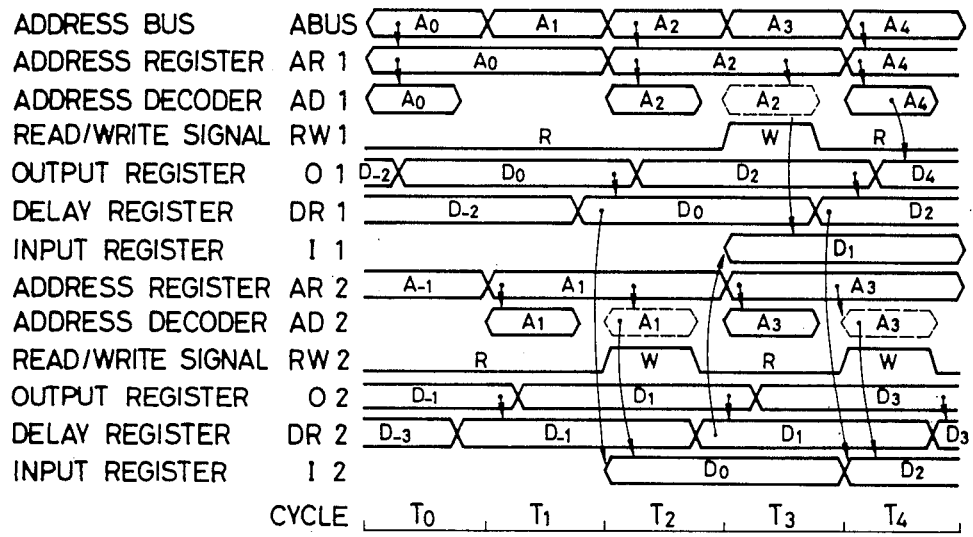
FIG. 2A is a time chart of the first embodiment.

FIG. 2A shows the time chart when the address for storing the data inside the memory matrix is shifted using the delay register (the read-modify-write operation).

Read-write signals RW1, RW2 are one kind of the control signals CS that are generated by the micro instruction, and control the memory operation to perform either the read operation or the write operation.

Figure 2B:
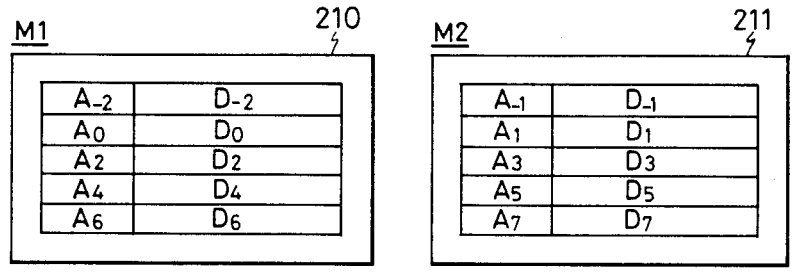
FIG. 2B is a table showing the correspondence between the address and the data before a shift operation.
Figure 2C:
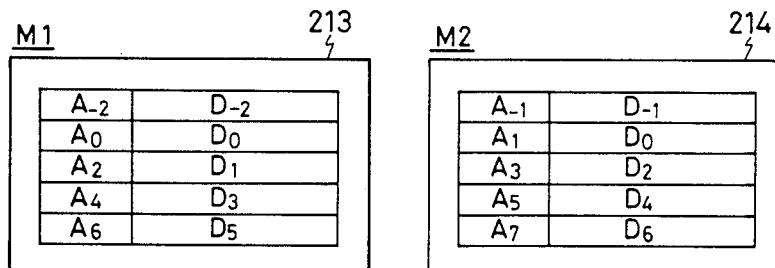
FIG. 2C is a table showing the correspondence between the address and the data after a shift operation.

FIG. 2B shows the correspondence between the data and the address before the shift while FIG. 2C shows the correspondence between the data and the address of the memory matrix in a period $T_4$ after the shift.

In FIG. 2A, if the address $A_o$ is even-numbered in a period $T_o$, the read-write signal RW1 is in the read mode so that the content $D_o$ of the corresponding memory matrix M1 is produced to the data bus DBUS, and the data $D_o$ is taken into the delay register DR1 in a period $T_1$. Then, the address of the address bus ABUS becomes $A_1$ in the period $T_1$, and the content $D_1$ of the corresponding memory matrix $M_2$ is read out and the data $D_1$ is taken into the delay register DR2 in a period $T_3$. Further, at time $T_2$ the address of the address bus ABUS becomes $A_2$, and the content $D_2$ of the corresponding memory matrix M1 is read out, and is taken into the delay register DR1 in a period $T_4$. If the micro instruction during this $T_2$ period is a data output instruction from the delay register, the address decoder AR2 decodes the address $A_1$ held by the address register AR2, takes the data $D_o$ of the delay register DR1 into the input register IR2, and writes it into the corresponding memory matrix MR2 (address $A_1$) through the column selector C2. (The read-write signal is in the write mode by the micro instruction.)

In the period $T_3$, the address decoder AD2 likewise decodes the address $A_3$ of the address bus ABUS, and the content $D_3$ of the corresponding memory matrix M2 is read out. At this time, if the micro instruction is the data output instruction from the delay register, the content $D_1$ of the delay register DR2 is written into the memory matrix M1 corresponding to the address $A_2$ held by the address register AR1. The same procedure is repeated for the period $T_4$ and so on, and the data address inside the memory matrix is increased by one.

As described above, the first embodiment of the invention shown in FIG. 1 can shorten the through-put time by letting the memory circuit execute only the read or write operation within one instruction cycle. Furthermore, in the read-modify-write operation, the address for storing the read-out data can be shifted by the pipeline technique without extending the through-put time by disposing the address register for taking the address and storing it only when the address is selected and the delay register for receiving the read-out data and storing it for each read operation, for each block.

Figure 3:
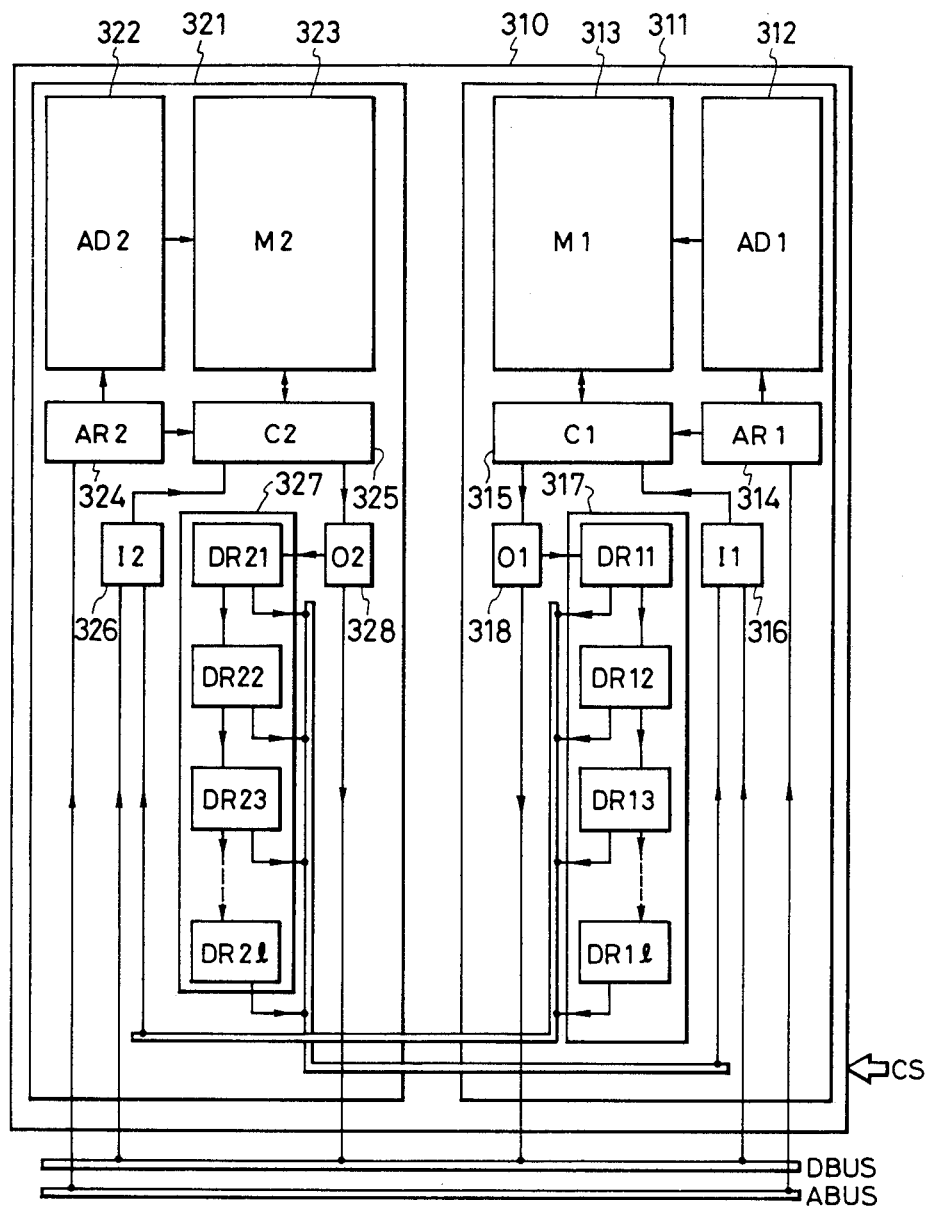
FIG. 3 is a block circuit diagram showing a second embodiment of the present invention.

FIG. 3 shows a second embodiment of the present invention. The drawing shows a memory circuit whose delay registers are constituted by l stages of shift registers DR11, 12, 13, ..., 1l (317), DR21, 22, 23, ..., 2l (327). When the micro instruction designates any one of the values of from 1 to l, an arbitrary odd address from the first to the (2l−1)th address can be shifted.

Figure 4:
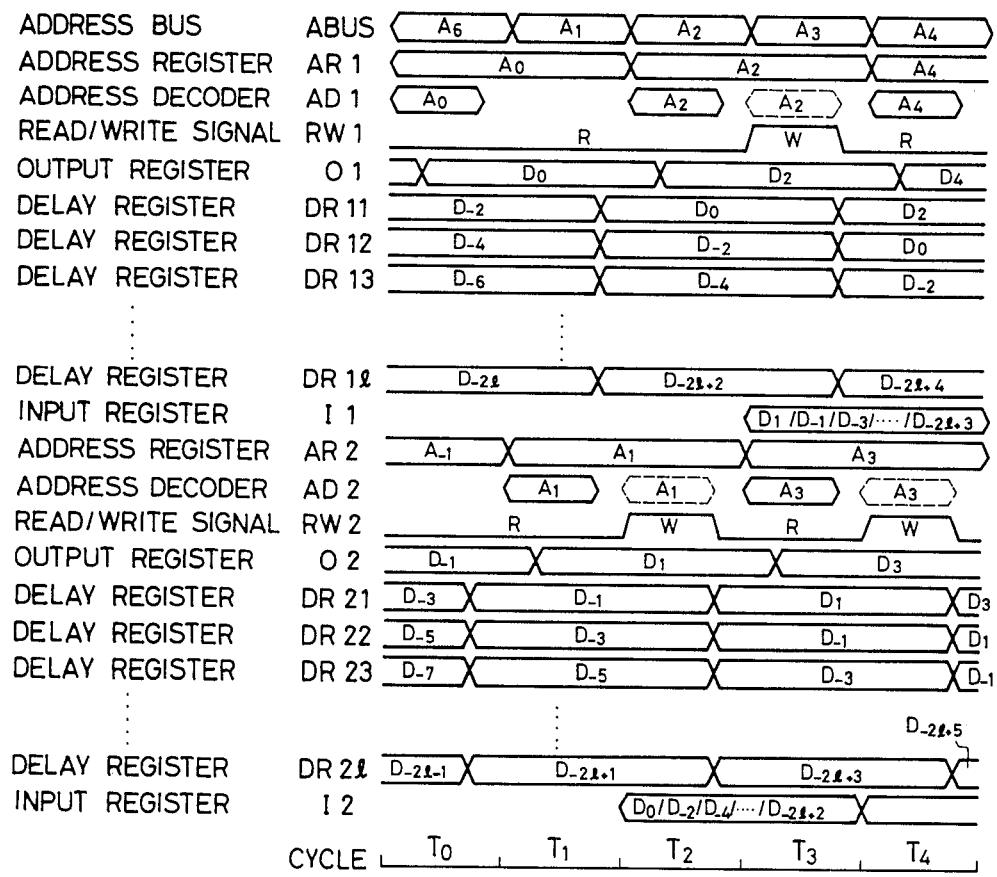
FIG. 4 is a time chart of the second embodiment.

FIG. 4 is a time chart corresponding to when the data address inside the memory matrix of the memory circuit shown in FIG. 3 is shifted. The data read out by the memory block whose address is selected is taken into the delay register DR11 (or DR21) of the lowermost order inside the block, and the data held by each delay register is sequentially shifted to the delay registers DR12, ..., 1l (or DR21, ..., 2l) of the upper order. In the period $T_2$, any of the data $D_o$, $D_{-2}$, $D_{-4}$, ..., $D_{-2l+2}$ of the delay registers DR11, 12, 13, ..., 1l is written into the memory matrix M2 corresponding to the address $A_1$. When this operation is repeated, an arbitrary odd address from the first address to the (2l−1)th address can be shifted while reading out the data inside the memory matrix.

FIG. 5A shows the correspondence between the data and the address before the shift, and FIG. 5B shows the correspondence between the data and the address of the memory matrix after the address is shifted by three addresses.

This second embodiment is effective for digital signal processing for two-dimensional data such as processing of an image. FIG. 6 shows an example when a two-dimensional image is divided into a definite number of pixels and the address $A_{ij}$ (i, j=1, 2, ..., n) for each pixel is allotted. In a filtering process for removing the noise of the image, signal processing is executed for every 3×3 pixels (the processing of data $D_{11}, D_{12}, D_{13}, D_{21}, D_{22}, D_{23}, D_{31}, D_{32}, D_{33}$ corresponding to the pixels $A_{11}, A_{12}, A_{13}, A_{21}, A_{22}, A_{23}, A_{31}, A_{32}, A_{33}$, respectively), and the read-out data are stored by shifting the address positions by three address. The second embodiment can easily accomplish such a processing at a high speed.

Figure 7:
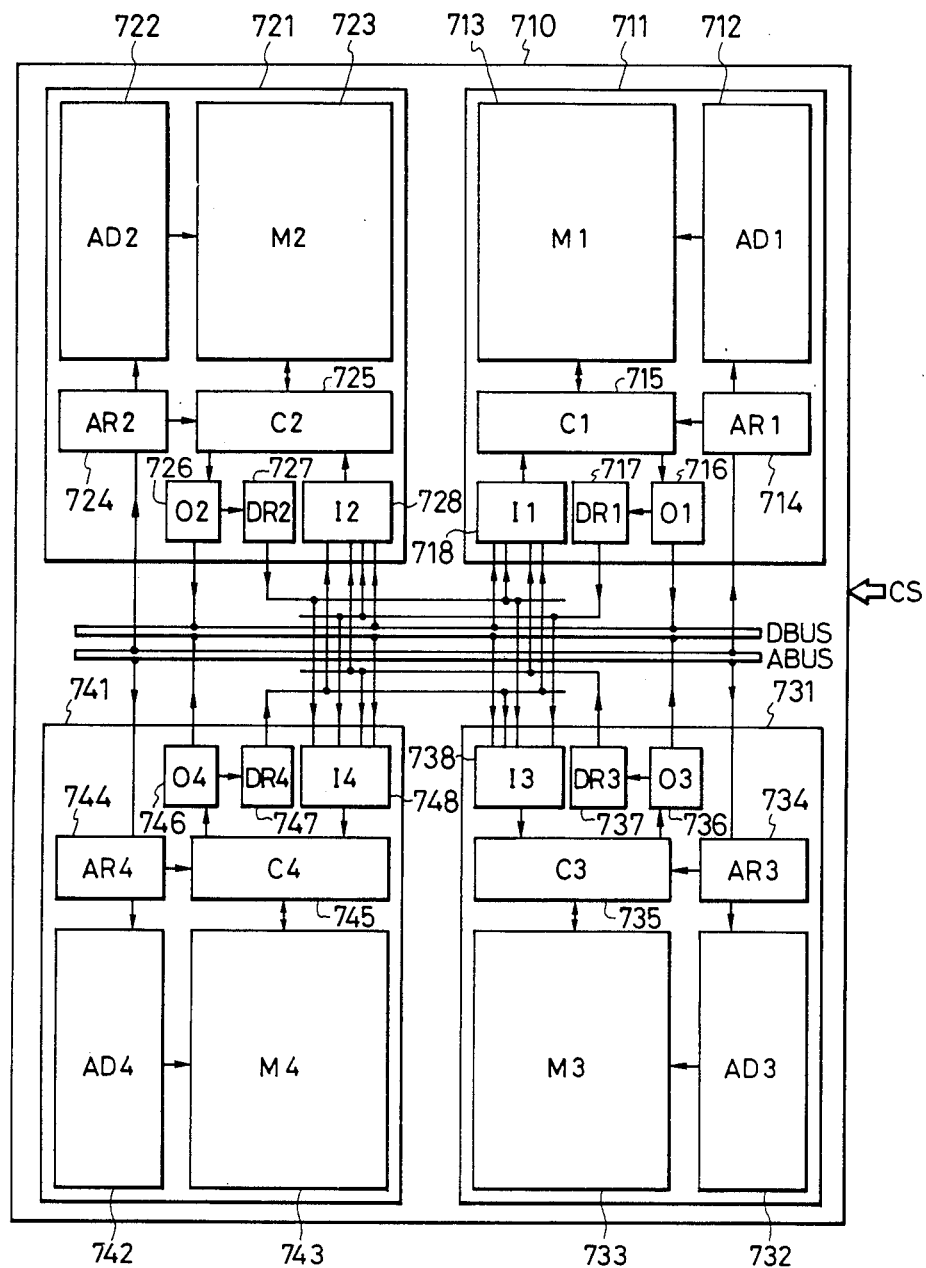
FIG. 7 is a block circuit diagram showing a third embodiment of the invention.

FIG. 7 shows a third embodiment of the present invention. This embodiment divides the memory into m memory blocks (at least two, FIG. 7 shows four memory blocks for the sake of description), and connects the input block of each memory block to one another in order to make it possible to shift an arbitrary address from the first address to the mth address.

In FIG. 7, the output of the delay register DR1 (717) is the input to the input data block I2 (726), I3 (736), I4 (746), and the output of DR2 (727) is the input to the input data block I1 (716), I3 (736). I4 (746). The output of DR3 (737) is the input to the input data block I1 (716), I2 (726), I4 (746), and the output of DR4 (747) is the input to the input data block I1 (716), I2 (726), I3 (736).

Figure 8:
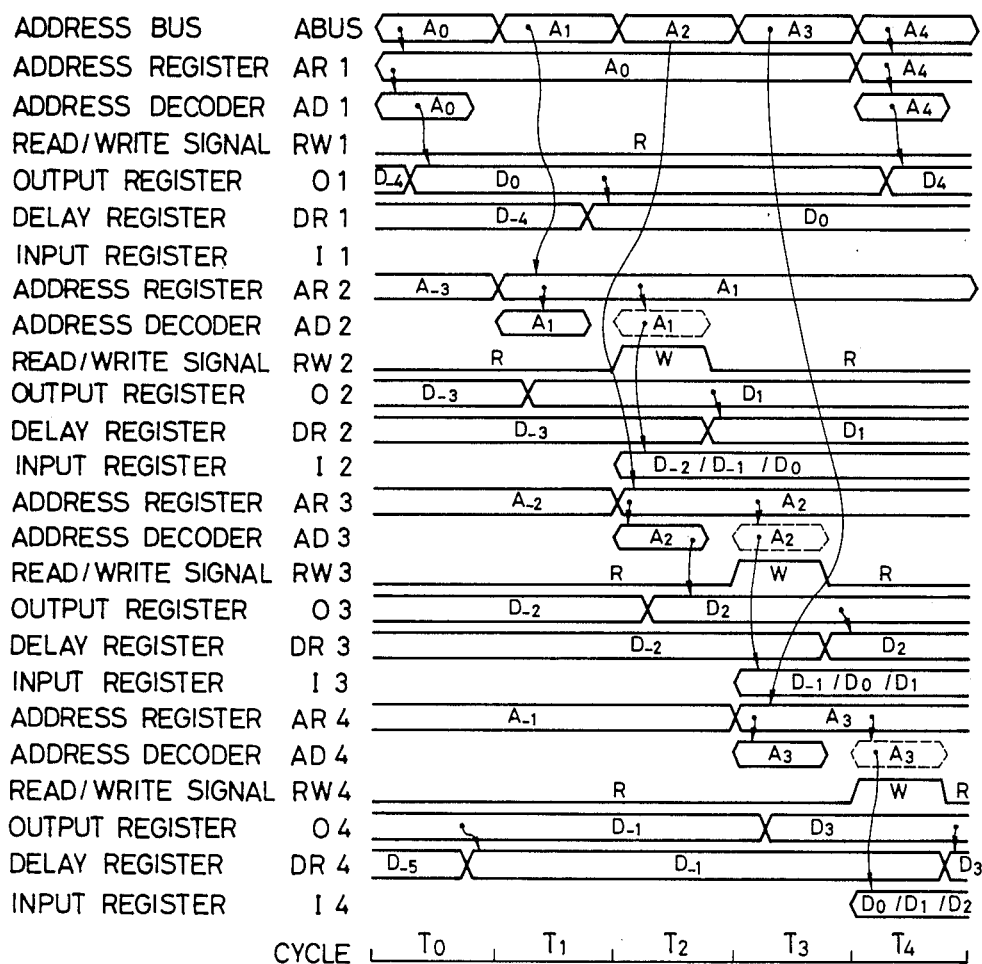
FIG. 8 is a time chart of the third embodiment.

FIG. 8 is a time chart corresponding to when the data address inside the memory matrix of the memory shown in FIG. 7 is shifted. The input data block of the memory block 721 takes in any of the data $D_{-2}, D_{-1}, D_o$ in the period $T_2$ in accordance with the micro instruction, and executes the writing operation to the memory matrix M2 corresponding to the address $A_1$. In the period $T_3$ and so on, the operation in the period $T_2$ is also repeated so that the addresses are shifted while the data inside the memory matrix are being sequentially read out.

FIG. 9A shows the correspondence between the address and the data before the shift in the period $T_o$, and FIG. 9B shows the correspondence between the address and the data when the data address is shifted by two addresses. In this embodiment, the addresses 910 and 914 are the addresses for the memory matrix M1 (713); 911 and 915 for M2 (723); 912 and 916 for M3 (733); and 913 and 917 for M4 (643). Such a shift function is particularly effective for image processing in the same way as the second embodiment.

Incidentally, the judgement whether an address selects a given memory block can be easily realized by allotting different codes to the memory blocks, decoding several bits (1 bit if only two memory blocks are provided) of the address bus and comparing them with the code given to each memory block. Further, it becomes possible to keep non-selected blocks under the waiting state by calculating the logical product between the code and the control signal inside each block.

The present invention that has thus been described can execute the read (or write) operation and shift the data address inside the memory matrix within the same cycle by means of the pipeline technique without extending the operation cycle time of the memory or without requiring a large number of cycle times. Therefore, the present invention provides a great effect in speeding up the operation speed. The operation which shifts by one the address for storing the data by use of the delay register while the data in the memory matrix is being read out is widely employed in signal processings in general. Therefore, the present invention provides a great advantage particularly for image processing for which a high speed operation is requisite and for voice analysis on a real time basis.

Specifically, since the second and third embodiments of the invention can shift n addresses, the invention provides a great advantage for executing data processing for filtering of large quantities of data in for example, image processing.

Since the memory block to be operated is selected by a the address in particular present invention, the operations of non-selected blocks are not effected, so that the increase in the power consumed, which is another critical problem in addition to the operation speed, can be essentially reduced.

What is claimed is:

1. A memory circuit consisting of n memory blocks, each of said memory blocks comprising:
   a memory matrix;
   address means for accessing data inside said memory matrix;
   data input means for inputting data into said memory matrix;
   data output means for outputting data from said memory matrix;
   address registers coupled with said address means for storing a data address; and
   at least one delay register coupled with said data output means for storing data that is read out of said memory matrix, said at least one delay register of each of said memory blocks being coupled with a data input means of at least one other memory block, such that data held by said at least one delay register is input into said data input means of said at least one other memory block in accordance with a predetermined instruction.

2. The memory circuit as defined in claim 1, further comprising means for writing the data which has been input into the data input means of a first memory block from the delay register of a second memory block in accordance with said predetermined instruction, into the memory matrix of said first memory block based on a data address stored in the address register of said memory block.

3. The memory circuit as defined in claim 1, wherein said address registers include means coupled with an address bus for accepting an address from said address bus when an address of the memory block in which said address register is disposed is designated.

4. The memory circuit as defined in claim 3, further comprising read-write means for either reading data from said memory matrix or writing data into said memory matrix on the basis of the address from said data bus.

5. A memory circuit comprising:

at least first and second memory blocks each having a plurality of address locations;

at least first and second data store means electrically connected to said at least first and second memory blocks, respectively;

address means for accessing said first memory block to provide first data therefrom to said first data store means in response to a first address signal from said address bus and for accessing said second memory block to provide second data therefrom to said second data store means in response to a second address signal from said address bus, said address means and said at least first and second data store means being responsive to a control signal so as to transfer said first data stored in said first data store means to said second memory block in response to a third address signal from said address bus and for transferring said second data stored in said second data store means to said first memory block in response to a fourth address signal from said address bus.

6. The memory circuit as defined in claim 5, wherein each of said at least first and second data store means comprises a single register for temporarily storing said first and second data, respectively.

7. The memory circuit as defined in claim 5, wherein each of said at least first and second data store means comprises a plurality of shift registers for storing first and second data, respectively, and for sequentially shifting said first and second data, respectively, through at least one of said plurality of shift registers.

8. A method of controlling a memory circuit which includes n memory blocks (n being an integer $\geq 2$), n data store means and an address means for accessing said n memory blocks comprising the steps of:

accessing a first memory block to provide first data therefrom to a first data store means in response to a first address signal;

accessing a second memory block to provide second data therefrom to a second data store means in response to a second address signal;

transferring said first data stored in said first data store means to said second memory block in response to a predetermined command signal and a third address signal; and transferring said second data stored in said second data store means to said first memory block in response to said predetermined command signal and a fourth address signal.

9. A method of controlling a memory circuit which includes n memory blocks (n being an integer $\geq 2$) with an address register and a delay register in each of said n memory blocks, said method comprising the steps of:

storing an address in the address register of a predetermined memory block only when said address corresponds to said predetermined memory block;

reading out data from said address in said predetermined memory block;

storing data in said delay register corresponding to said predetermined memory block; and writing previously stored data from said delay register into an address of a different memory block at substantially the same time that said data is stored in said delay register in response to a read-modify-write instruction.

* * * * *